United States Patent [19]

Ishikiriyama

[11] Patent Number: 5,946,584
[45] Date of Patent: Aug. 31, 1999

[54] METHOD FOR MANUFACTURING A DIELECTRIC ISOLATION SUBSTRATE

[75] Inventor: Mamoru Ishikiriyama, Tokyo, Japan

[73] Assignee: Oki Electric Industry Co., Ltd., Tokyo, Japan

[21] Appl. No.: 08/909,079

[22] Filed: Aug. 14, 1997

[30] Foreign Application Priority Data

Mar. 18, 1997 [JP] Japan .................................... 9-064518

[51] Int. Cl.$^6$ ................................................ H01L 21/76
[52] U.S. Cl. ............................................ 438/459; 438/406
[58] Field of Search .................................. 438/406, 459, 438/977, FOR 262, FOR 107; 148/DIG. 12

[56] References Cited

FOREIGN PATENT DOCUMENTS 61-292934   12/1986   Japan .
6-151572    5/1994    Japan .

OTHER PUBLICATIONS

Sugawara et al., "New Dielectric Isolation for High Voltage Power ICS by Single Silicon Direct Bonding (SPSDB) Technique," Proceedings of 1992 International Symposium on Power Semiconductor Devices & ICs, Tokyo, pp. 316–321.

*Primary Examiner*—George Fourson
*Attorney, Agent, or Firm*—Jones, Volentine, Steinberg & Whitt, L.L.P.

[57] ABSTRACT

In a method for manufacturing a dielectric isolation substrate according to the present invention, during the process of pressing a semiconductor substrate (wafer), a dummy chip 103 is positioned toward the outside edge of the wafer with respect to the LSI chip 102, which is pressed into contact last, V-grooves 103A in the dummy chip 103 are formed to be deeper than V-grooves 102A in the LSI chip 102 so that voids can be effectively pushed into the dummy chip 103. Consequently, isolation of the LSI chip caused by voids can be prevented, thereby achieving an improvement in yield.

9 Claims, 11 Drawing Sheets

PRIOR ART

PRIOR ART

PRIOR ART

PRIOR ART

PRIOR ART

METHOD FOR MANUFACTURING A DIELECTRIC ISOLATION SUBSTRATE

BACKGROUND OF THE INVENTION

The present invention relates to a method for manufacturing a semiconductor substrate that constitutes a semiconductor device and in particular, it relates to a method for manufacturing a dielectric isolation substrate.

In an integrated circuit device in which the withstand voltage among the elements is high (power IC), it is necessary to insulate the individual elements that are to be integrated from one another. Publications such as JP/A/61-292934, IEEE ISPSD 1992 pp. 316–321 and the like disclose methods for manufacturing bonded type dielectric isolation substrates that achieve such a semiconductor device structure.

The following is an explanation of a method for manufacturing a bonded type dielectric isolation substrate in the prior art as disclosed in the publications mentioned above in reference to FIGS. 12 and 13.

(1) First, as shown in FIG. 12(a), V-grooves 502 with a desired depth are formed on the main surface of a single crystalline Si substrate (wafer) 501 with, for instance, (100) crystal orientation planes, by employing an anisotropic etching technology.

It is to be noted that in order to prevent the single crystalline Si substrate 501 from being damaged by the presence of the V-grooves 502, it is desirable to provide an LSI chip 506 pattern layout which uses an orientation flat 501A for reference on the single crystalline Si substrate 501 to ensure that no grooves are formed on the circumferential edge portion of the single crystalline Si substrate 501.

(2) Next, as illustrated in FIG. 12(b), an embedded diffusion layer 503 with the same conduction type as that of the single crystalline Si substrate 501, and then an isolation insulating film 504, separating the individual elements, are formed at the main surface of the single crystalline Si substrate 501 where the V-grooves 502 have been formed.

(3) Next, as illustrated in FIG. 12(c), a polycrystalline Si layer 505 is formed on the single crystalline Si substrate 501 via the isolation insulating film 504. This polycrystalline Si layer 505 is required to have a thickness which is at least large enough to fill the V-grooves 502, and the thickness is normally set at twice the depth of the V-grooves 502.

(4) Next, as illustrated in FIG. 12(d), the polycrystalline Si layer 505 is removed down to the position indicated with line A—A (see FIG. 12(c)) so that the surface of the polycrystalline Si layer 505 extends parallel to the bottom surface of the single crystalline Si substrate 501. Then, by performing a mirror treatment on the main surface of the polycrystalline Si layer 505, a mirror finished surface 506 with a maximum surface roughness of 500 Å is formed.

(5) Next, as illustrated in FIG. 13(a), the main surface of a supporting substrate 508 upon which a 0.5 $\mu$m oxide film 507 is formed, and the main surface of the single crystalline Si substrate 501 with the polycrystalline Si layer 505 having had the mirror finish treatment performed on its main surface, arc cleaned and activated. After this, the main surfaces of the supporting substrate 508 and the single crystalline Si substrate 501 are pressed into close contact for bonding.

During this pressing step, defective contact, i.e., the formation of so-called voids, is normally prevented by using a supporting jig 517 to gradually press the main surfaces together from one corner of the substrate, i.e., from the side of the semiconductor substrate 501 with the orientation flat 501A, for instance, as illustrated in FIG. 15.

Next, by performing high temperature heat treatment at, for instance, 1200° C. for two hours, a bonded substrate 509 is formed.

(6) Next, as illustrated in FIG. 13(b), by polishing the main surface of the single crystalline Si substrate 501 at the opposite side down to the position indicated by the line B—B (see FIG. 13(a)), a dielectric isolation substrate 511 provided with single crystalline Si islands 510 which are isolated from one another is formed.

However, with the manufacturing method for a dielectric isolation substrate in the prior art described above, during the mirror finish step performed on the polycrystalline Si layer 505 illustrated in FIG. 12(d), a depression 505A of approximately 100 Å is formed at the polycrystalline Si layer on a V-groove 502, as indicated within the circle in an enlargement of the central portion shown in FIG. 16, due to the difference between the orientation of the flat portion of the semiconductor substrate 501 and the polycrystalline Si layer 505 on the V-groove 502. The depth of the depression 505A becomes more pronounced as the V-groove 502 becomes deeper.

Then, during the pressing step for the single crystalline Si substrate 501 and the supporting substrate 508 illustrated in FIG. 15, the speed at which pressing is performed is reduced in the area where the depression 505A is formed compared to the flat area as the depth of the depression 505A becomes greater and also as the pattern ratio of the depression 505A becomes larger. Because of this, as shown in FIG. 17, in the LSI chip pattern area 506, which is formed on the single crystalline Si substrate 501 with the depression 505A, the speed at which the pressing is performed is reduced compared to that in the flat areas at the circumferential edge portion where there is no pattern (the lengths of the arrows in the figure indicate the pressing speed), sometimes resulting in a small void (unbonded portion) 507 remaining within the LSI chip area.

Although such voids do not normally cause problems such as separation of an LSI chip during the wafer production process, they are listed as one of the causes of chip separation during subsequent assembly processes, constituting a cause for reduced yield.

In order to avoid formation of such voids and to achieve a more stable bonded structure, Japanese Unexamined Patent Publication No. 1994-151572, for instance, discloses a method whereby a polycrystalline silicon layer is constituted as a two-fold structure to fill the voids during the heat treatment for bonding.

However, even when this method is employed, formation of voids in the LSI chip pattern area is not entirely prevented. Also, the number of steps is increased.

SUMMARY OF THE INVENTION

Accordingly, a first object of the present invention is to provide a new and superior manufacturing method for a dielectric isolation substrate whereby voids are prevented from affecting the LSI chip area in the heat treatment for bonding by ensuring that they are absorbed into the peripheral area.

A second object of the present invention is to provide a new and superior manufacturing method for a dielectric isolation substrate in which voids in the LSI chip area can be prevented without having to increase the number of manufacturing steps.

A third object of the present invention is to provide a new and superior manufacturing method for a dielectric isolation substrate in which isolation of an LSI chip caused by voids is prevented, to achieve an improvement in yield.

In order to achieve the objects described above, the method of manufacturing a dielectric isolation substrate according to the present invention comprises the following steps.

First, grooves with a first depth are machined into a semiconductor element formation area and dummy grooves with a second depth that is greater than the first depth are formed in the peripheral area adjacent to the semiconductor element formation area.

Next, an insulating film is formed at the main surface of the semiconductor substrate where the grooves and the dummy grooves have been formed.

Next, apolycrystalline silicon layer with a thickness that exceeds the first and second groove depths is formed at the main surface of the semiconductor substrate where the insulating film has been formed.

Next, a mirror surface treatment is performed on the polycrystalline silicon layer, and then another semiconductor substrate on which oxidation treatment has been performed is pasted onto the surface on which the mirror surface treatment has been performed.

Next, by polishing the semiconductor substrate starting from the main surface on the opposite side, the insulating film is exposed to produce a dielectric isolation substrate provided with single crystalline Si islands 510 that are isolated from one another.

With this structure, since voids can be pushed into the peripheral portion of the semiconductor element formation area where the dummy grooves are formed, it is possible to effectively prevent voids from forming in the semiconductor element formation area.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings.

PREFERRED EMBODIMENTS OF THE INVENTION

The following is a detailed explanation of the preferred embodiments of the present invention in reference to the drawings.

Figure 1:
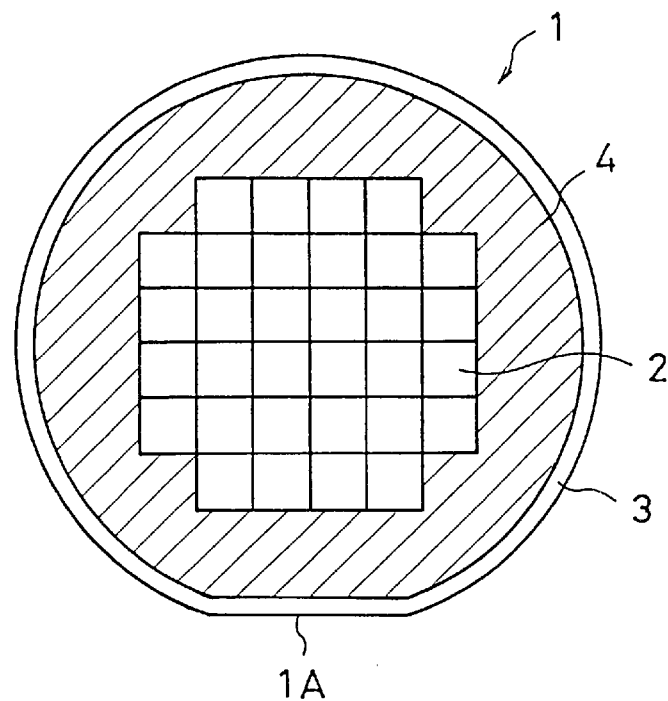
FIG. 1 is an LSI chip pattern layout diagram illustrating a first embodiment according to the present invention.

FIG. 1 is an LSI chip pattern layout diagram illustrating the first embodiment according to the present invention.

In this figure, reference number 1 indicates a semiconductor substrate (wafer), reference number 1A indicates an orientation flat in the semiconductor substrate 1, reference number 2 indicates an LSI chip, reference number 3 indicates a circumferential edge portion of the semiconductor substrate 1 and reference number 4 indicates a peripheral area adjacent to the LSI chip area (semiconductor element formation area) in the semiconductor substrate 1. However, it is to be noted that as shown in the figure, the outermost circumferential edge portion 3 of the semiconductor substrate 1 is not included in the peripheral area 4.

In this embodiment, in the peripheral area 4 (the area that does not include the circumferential edge portion 3 of the semiconductor substrate 1) of the LSI chip area (semiconductor element formation area) of the semiconductor substrate 1, dummy grooves are formed having a second depth which is greater than the depth of the grooves (see FIG. 12(*b*)) having a normal depth (first depth) in the semiconductor element formation area.

The following is an explanation given in reference to specific examples.

Figure 2:
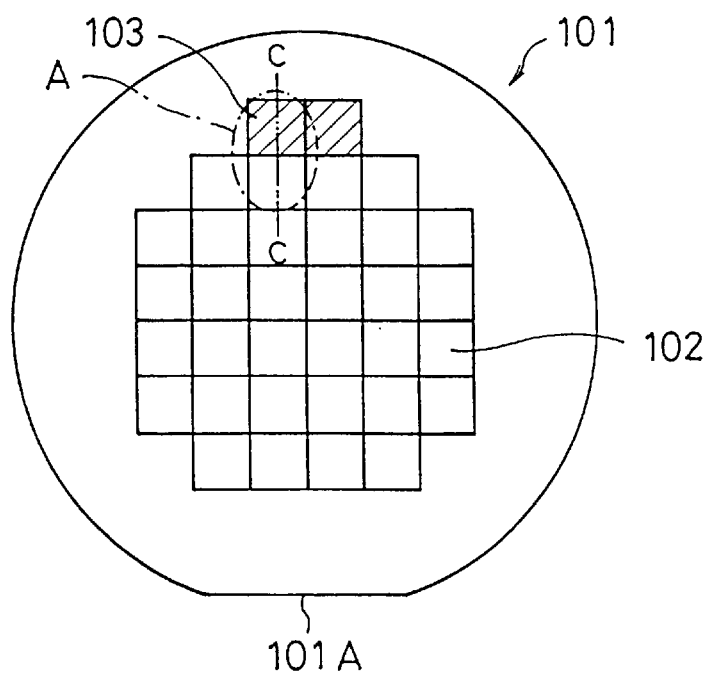
FIG. 2 is an LSI chip pattern layout diagram illustrating a second embodiment according to the present invention.
Figure 3:
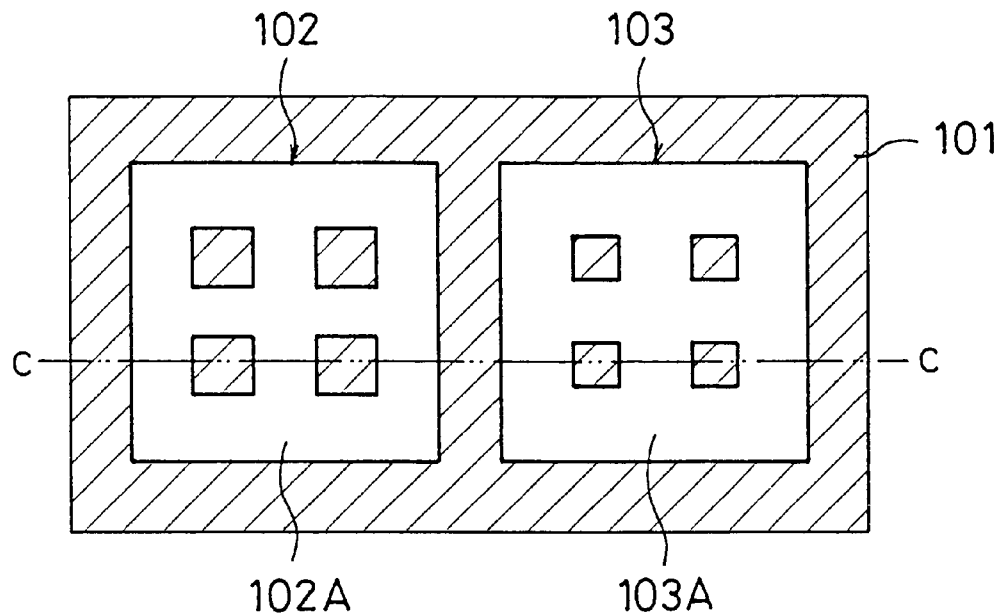
FIG. 3 is an enlarged plan view of the isolation pattern in area A (line C—C) in FIG. 2.
Figure 4:
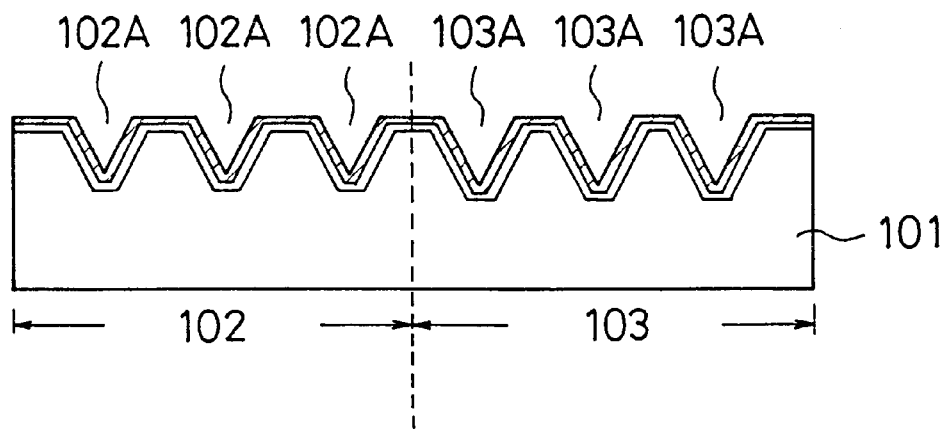
FIG. 4 is a cross section through line C—C in FIG. 3.

FIG. 2 is an LSI chip pattern layout diagram illustrating the second embodiment according to the present invention, FIG. 3 is an enlarged plan view of the isolation pattern in area A (line C—C) in FIG. 2 and FIG. 4 is a cross section through line C—C in FIG. 3.

Figure 15:
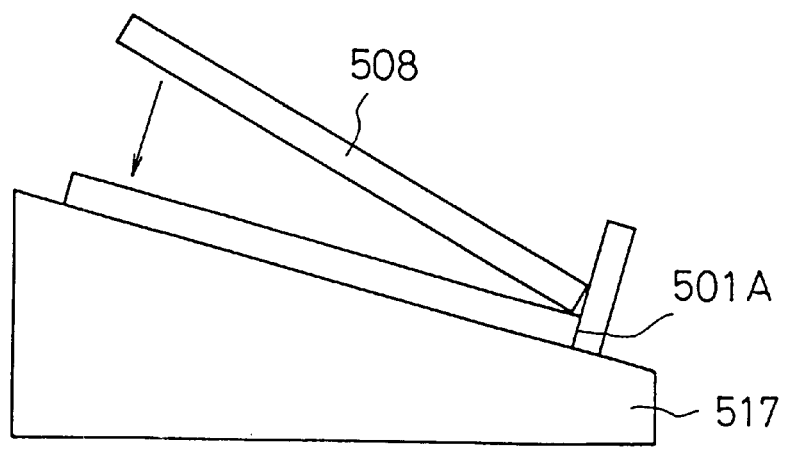
FIG. 15 illustrates the pressing step of a single crystalline Si substrate and the supporting substrate in the prior art.
Figure 16:
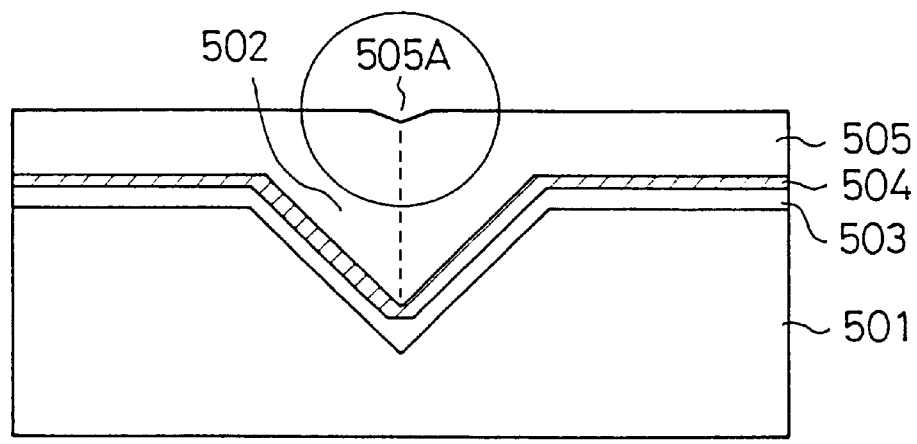
FIG. 16 is an enlarged cross section illustrating the formation of a polycrystalline layer over a V-groove on a single crystalline Si substrate in the prior art.
Figure 17:
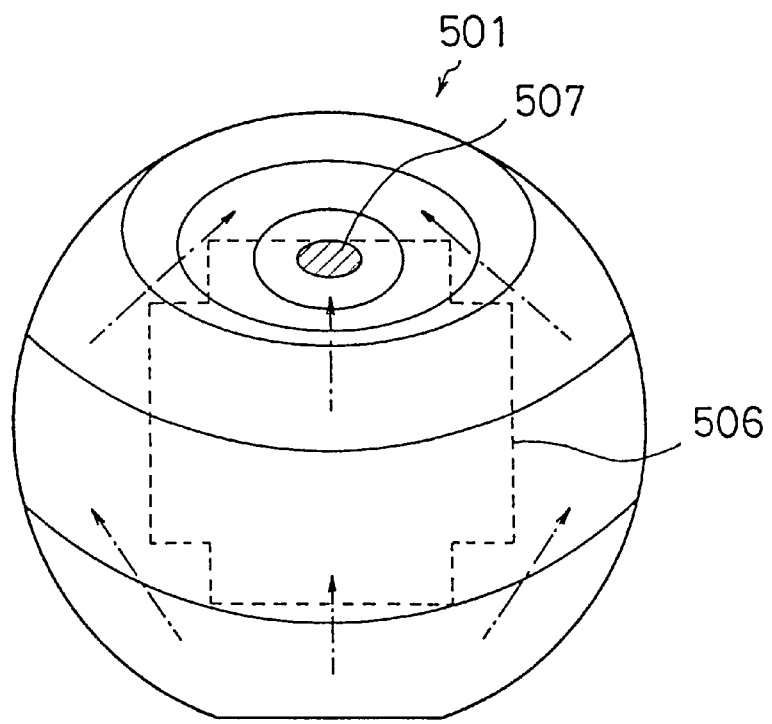
FIG. 17 illustrates the problems that the prior art technology presents.

In the example illustrated in FIG. 2, a dummy chip 103 is placed adjacent to an LSI chip 102 on the opposite side from an orientation flat 101A of a semiconductor substrate 101. It is essential that the position of the dummy chip 103 where the dummy grooves are formed be set at the side toward the peripheral area adjacent to the LSI chip area that will be pressed into contact last, as explained in reference to FIG. 15. In other words, in the example illustrated in the figure, the dummy chip 103 where the dummy grooves are formed, is constituted in a portion of the peripheral area adjacent to the LSI chip area (semiconductor element formation area) of the semiconductor substrate 101 which does not include the circumferential edge portion of the semiconductor substrate 101. It is to be noted that while in the example illustrated in the figure, the dummy chip 103 is positioned on the opposite side from the orientation flat 101A, the present invention is not limited to the positioning in this example. It is desirable to place the dummy chip 103 on the opposite side from the position at which the process of pressing is commenced, i.e., at the side of the peripheral area adjacent to the LSI chip area that is pressed into contact last.

FIGS. 3 and 4 respectively show a plan view and a cross section of the isolation pattern for the LSI chip 102 and the dummy chip 103 during the step of forming the V-grooves in the first embodiment. The important point to be noted here is that the depth of the V-grooves 103A in the dummy chip 103 is set greater than the depth of the V-grooves 102A in the LSI chip 102.

As explained above, in the first embodiment, since the dummy chip 103 is positioned toward the outside edge of the wafer with respect to the LSI chip 102 that is pressed into contact last and the depth of the V-grooves 103A in the dummy chip 103 is set greater than the depth of the V-shape grooves 102A in the LSI chip 102, it is possible to effectively push voids into the dummy chip 103 during the step of pressing the wafer (semiconductor substrate).

Consequently, it becomes possible to prevent formation of voids in the LSI chip 102, achieving an improvement in yield.

Next, an explanation is given of the third embodiment according to the present invention.

Figure 5:
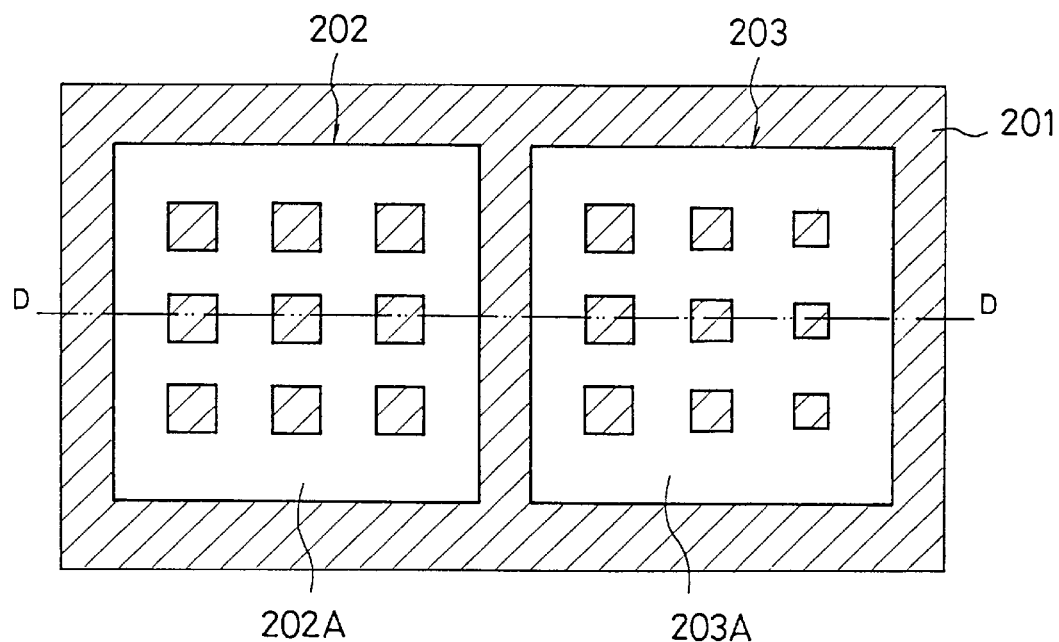
FIG. 5 is an enlarged plan view of the isolation pattern illustrating a third embodiment according to the present invention.
Figure 6:
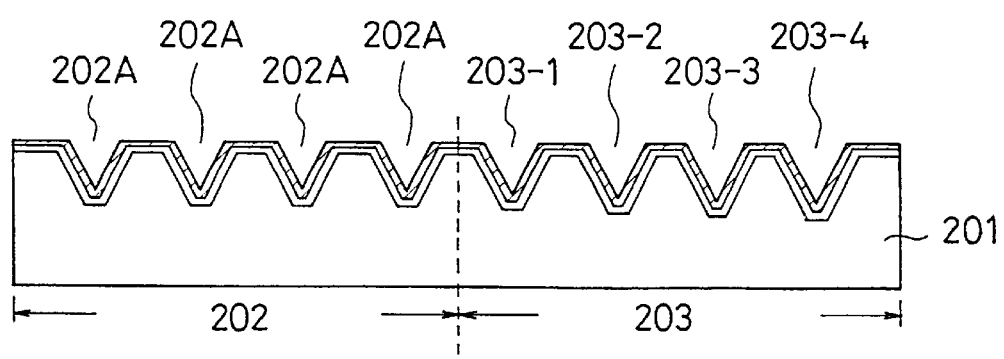
FIG. 6 is a cross section through line D—D in FIG. 5.

FIG. 5 is an enlarged plan view of the isolation pattern illustrating the third embodiment according to the present invention and FIG. 6 is a cross section through line D—D in FIG. 5.

As these figures illustrate, in this embodiment, grooves 203A formed in a dummy chip 203 are formed deeper than grooves 202A formed in an LSI chip 202 in a semiconductor substrate (wafer) 201. Furthermore, the V-grooves 203A in the dummy chip 203 are formed so that they become deeper toward the outside of the dummy chip 203. In other words, the grooves are formed in such a manner that their depths become gradually greater toward the outside starting with the innermost groove 203-1 through the grooves 203-2, 203-3, 203-4.

Thus, in the third embodiment, since the V-grooves 203A of the dummy chip 203 are formed so that they become gradually deeper toward the outside of the dummy chip 203, it is possible to push voids toward the outside of the dummy chip 203, thereby achieving a further improvement in yield.

Figure 7:
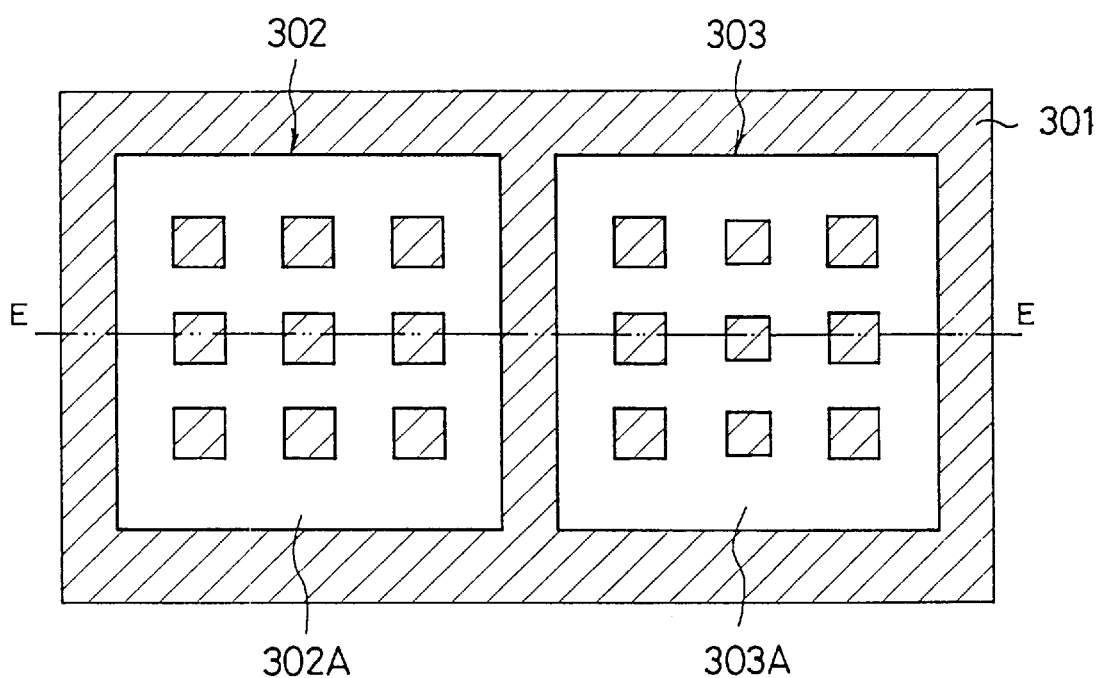
FIG. 7 is an enlarged plan view of the isolation pattern illustrating a fourth embodiment according to the present invention.
Figure 8:
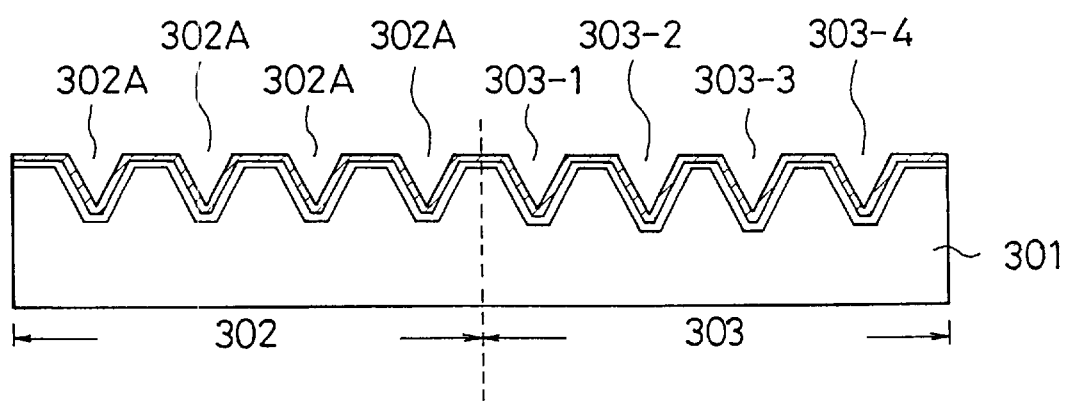
FIG. 8 is a cross section through line E—E in FIG. 7.

FIG. 7 is an enlarged plan view of the isolation pattern illustrating the fourth embodiment according to the present invention and FIG. 8 is a cross section through line E—E in FIG. 7.

As the figures illustrate, in this embodiment, grooves 303A formed in a dummy chip 303 are formed deeper than grooves 302A formed in an LSI chip 302 in a semiconductor substrate (wafer) 301, and moreover, the V-grooves 303A in the central area of the dummy chip 303 are formed so that they are deeper at than the grooves in the peripheral area of the dummy chip 303. In other words, compared to the depth of the V-grooves 303-1 and 303-4 in the peripheral area of the dummy chip 303, the depth of the V-grooves 303-2 and 303-3 at the central area is greater.

Thus, in the fourth embodiment, since the V-grooves 303A of the dummy chip 303 are formed to ensure that the V-grooves 303-2 and 303-3 in the central area of the dummy chip 303 are deeper than the V-grooves 303-1 and 303-4 in the peripheral areas of the dummy chip 303, it is possible to reliably push voids into the center of the dummy chip 303, thereby achieving a further improvement in yield.

Next, an explanation is given of the fifth embodiment according to the present invention.

Figure 9:
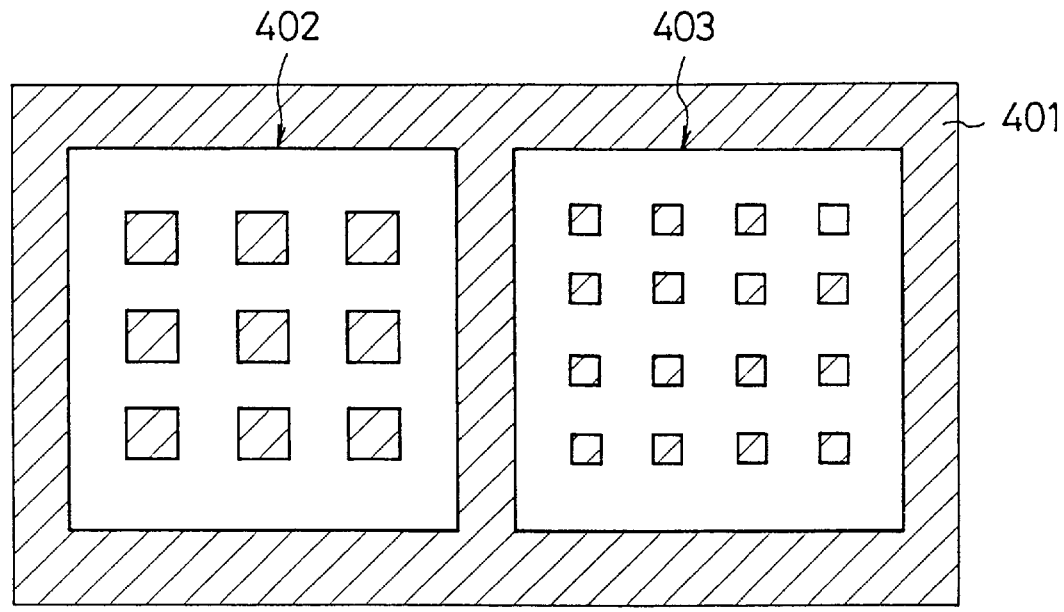
FIG. 9 is an enlarged plan view of the isolation pattern illustrating a fifth embodiment according to the present invention.

FIG. 9 is an enlarged plan view of the isolation pattern illustrating the fifth embodiment according to the present invention.

As FIG. 9 illustrates, this embodiment is constituted by ensuring that the isolation pattern density in a semiconductor substrate (wafer) 401 is higher in a dummy chip 403, i. e., the number of grooves per unit area is larger in the dummy chip 403 than in an LSI chip 402.

Thus, in the fifth embodiment, since the isolation pattern density in the dummy chip 403 is set higher than in the LSI chip 402, it is possible to effectively push voids into the dummy chip 403.

In addition, by freely combining the fifth embodiment with the first–fourth embodiments, voids become even more easily taken in to the dummy chip, promising even more improvement in the LSI chip yield.

Figure 10:
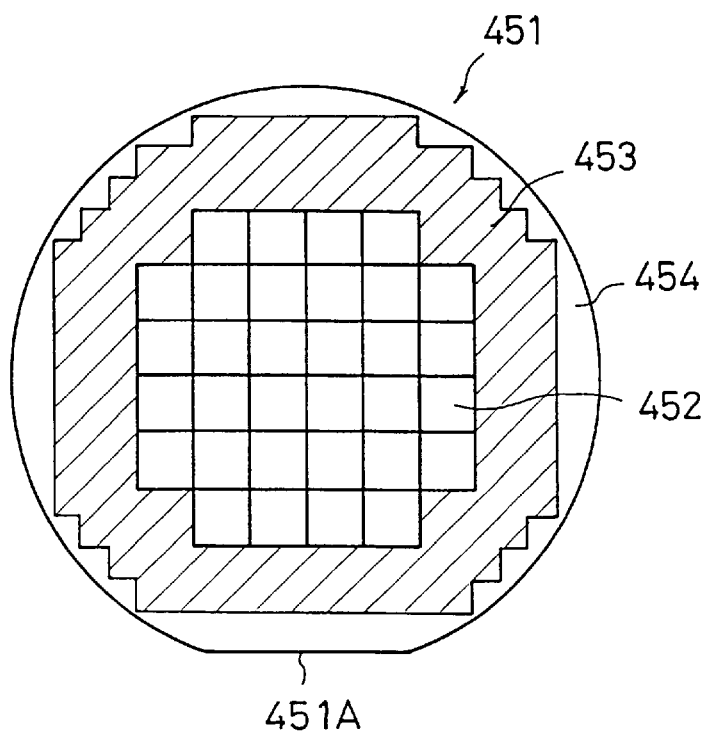
FIG. 10 is an LSI chip pattern layout diagram illustrating a sixth embodiment according to the present invention.
Figure 11:
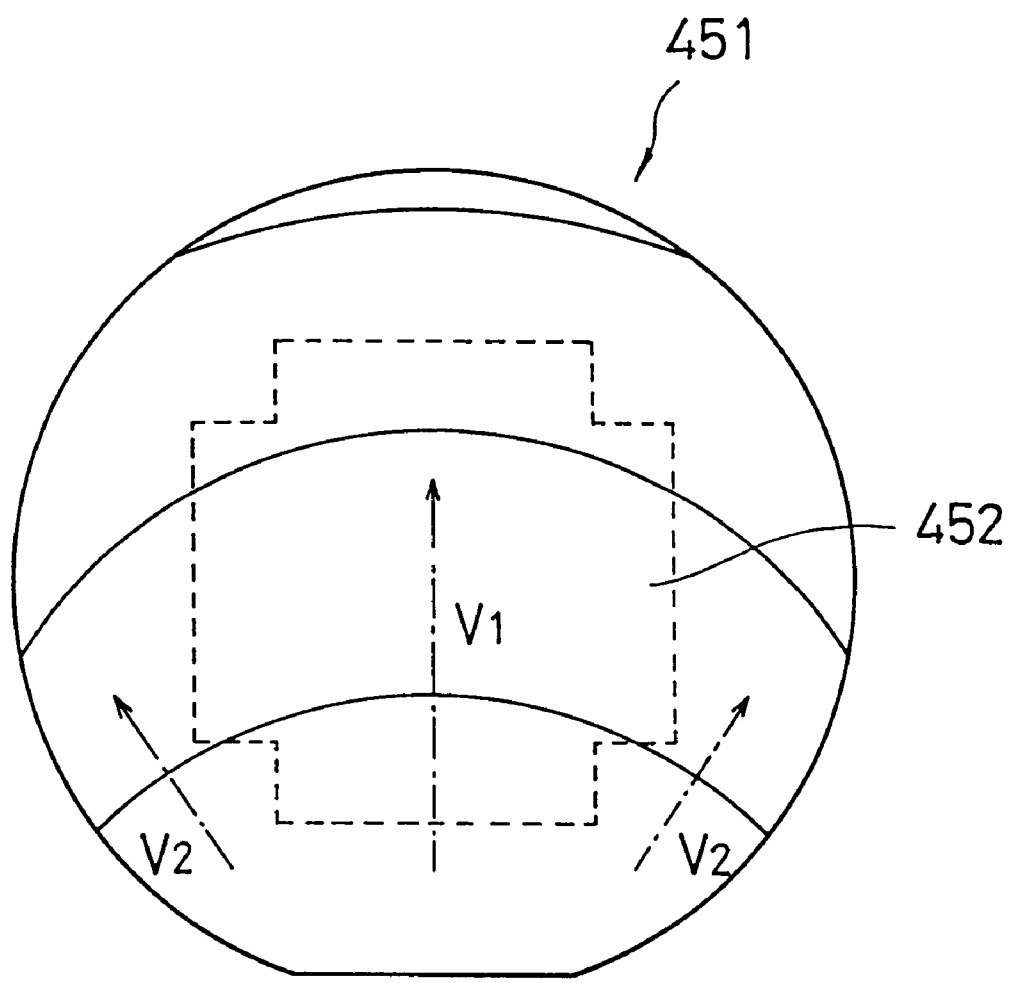
FIG. 11 illustrates advantages of the sixth embodiment according to the present invention.
Figure 12A:
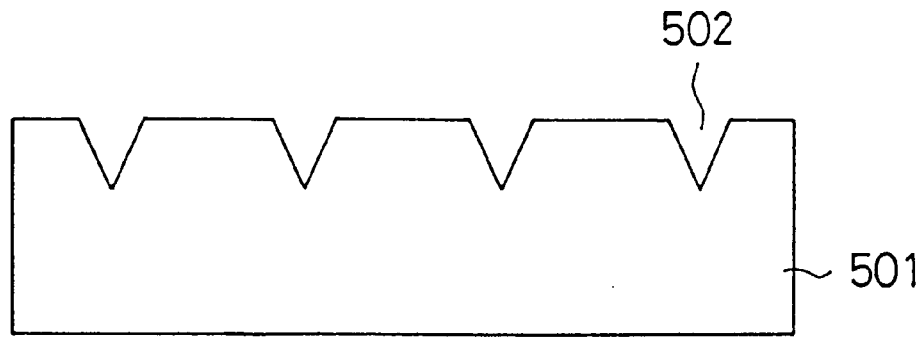
FIGS. 12A–12D are a cross section of a manufacturing step (1) for a dielectric isolation substrate in the prior art.
Figure 12B:
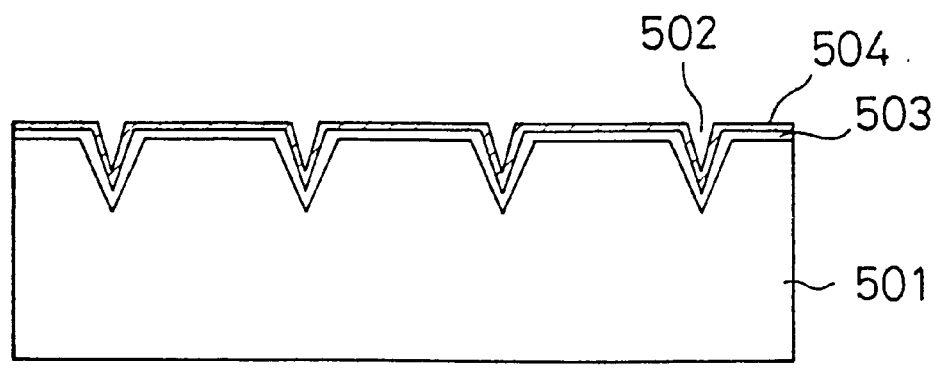
Figure 12C:
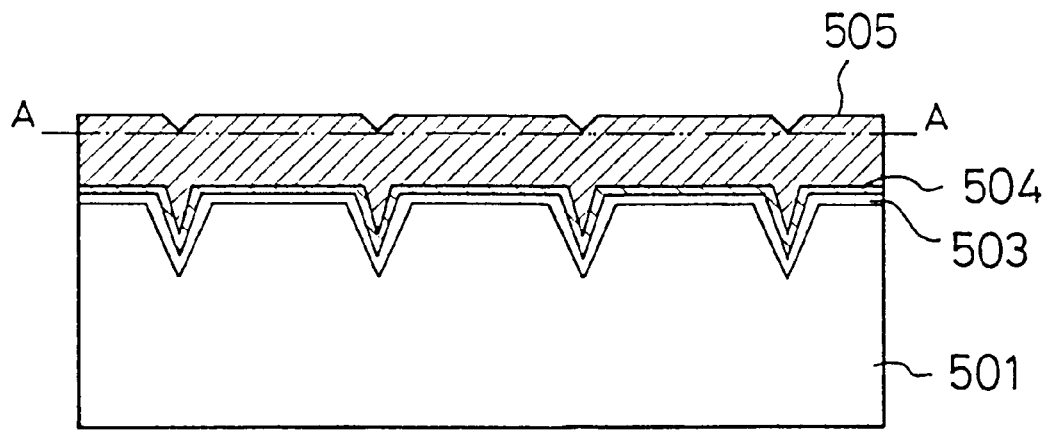
Figure 12D:
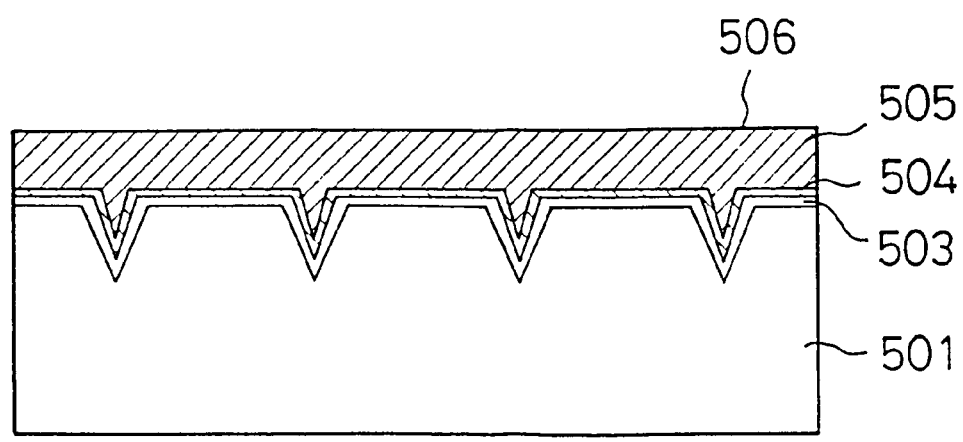
Figure 13A:
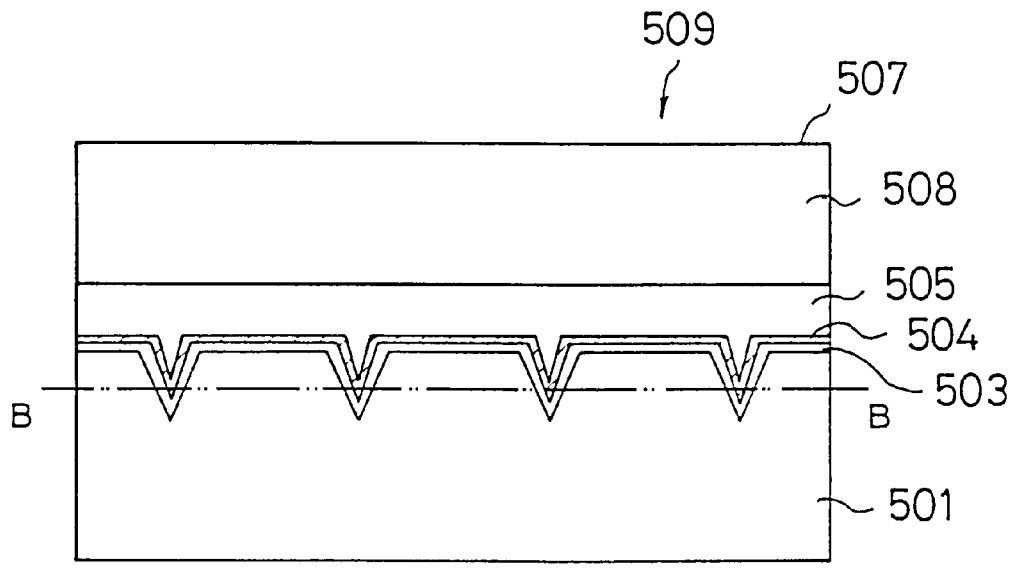
FIGS. 13A and 13B are a cross section of a manufacturing step (2) for a dielectric isolation substrate in the prior art.
Figure 13B:
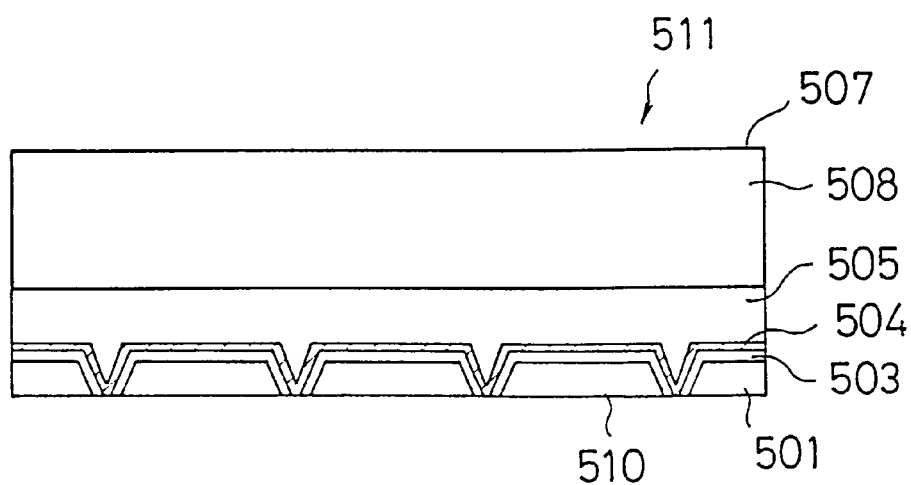
Figure 14:
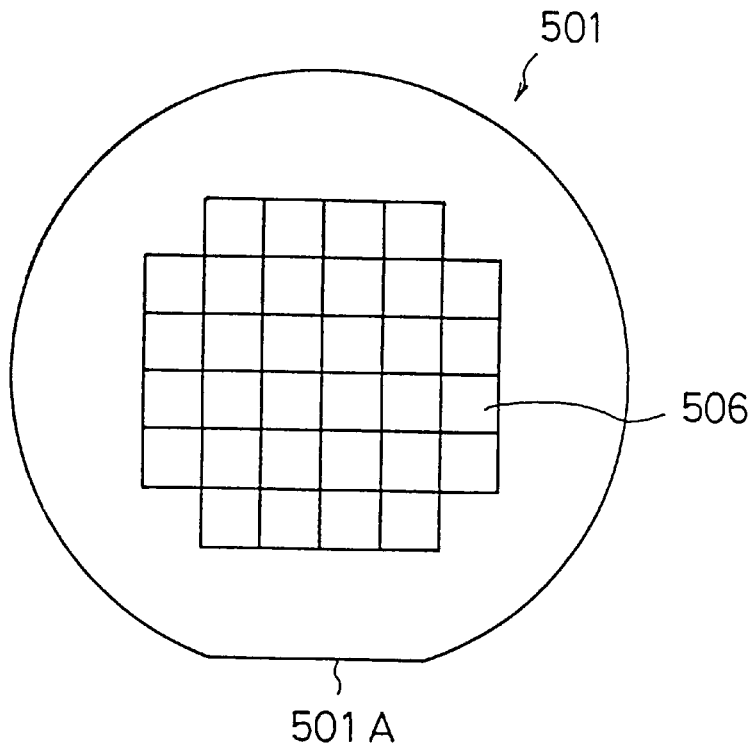
FIG. 14 is an LSI chip pattern layout diagram in the prior art.

FIG. 10 is an LSI chip pattern layout diagram illustrating the sixth embodiment according to the present invention and FIG. 11 illustrates advantages achieved in the sixth embodiment according to the present invention.

In FIG. 10, LSI chip area 452 and a dummy chip area 453 in a semiconductor substrate 451 are shown, and any one of the structures disclosed in the first–fifth embodiments may be adopted for the dummy chip area 453. Reference number 451A indicates an orientation flat.

In this embodiment, the dummy chip area 453 is positioned over the entire surface of the peripheral area around the LSI chip area 452, not including the circumferential edge portion 454 of the semiconductor substrate 451.

In the sixth embodiment, since the dummy chip area 453 is placed over the entire surface of the peripheral area of the LSI chip area 452 in this manner, during the pressing step of the semiconductor substrate 451, the speed V 2 of pressing in the peripheral area is lower than the speed V 2 of pressing at the central portion of the semiconductor substrate 451, as shown in FIG. 11.

Consequently, since formation of voids in the area where the LSI chips 452 are formed, which tends to occur in the prior art, is avoided, a significant improvement in yield is achieved.

While the manufacturing method for a dielectric isolation substrate according to the invention has been particularly shown and described with reference to preferred embodiments thereof, the present invention is not limited to these examples and it will be understood by those skilled in the art that various changes in form and detail may be made therein without departing from the spirit, scope and teaching of the invention.

As has been explained in detail, according to the present invention, voids can be effectively pushed into the dummy grooves which are formed in an area other than the semiconductor element formation area. As a result, formation of voids in the LSI chip can be prevented, achieving an improvement in yield.

In addition, since the isolation pattern density in the area other than the semiconductor element formation area is set higher than that in the LSI chip area, voids can be effectively pushed into the area other than the semiconductor element formation area.

Furthermore, by providing the dummy grooves over the entire surface of the peripheral area of the semiconductor element formation area, the pressing speed in the peripheral areas can be made lower than that in the central portion of the semiconductor substrate (wafer) during a semiconductor substrate (wafer) pressing step. As a result, voids are pushed into the dummy groove formation area, eliminating the formation of voids in the semiconductor element formation area, resulting in a significant improvement in yield.

The disclosure in Japanese Patent Application No. 9-64518 filed on Mar. 18, 1997, including specifications, claims, drawings and summary is incorporated herein by reference in its entirety.

What is claimed is:

1. A method for manufacturing a dielectric isolation substrate comprising:

a step in which grooves with a first depth are machined into a semiconductor element formation area at a main surface of a semiconductor substrate and dummy grooves with a second depth which is greater than said first depth are formed in a peripheral area of said semiconductor element formation area;

a step in which an insulating film is formed at said main surface of said semiconductor substrate where said grooves and said dummy grooves have been formed;

a step in which a polycrystalline silicon layer with a thickness greater than said first depth and said second depth is formed at said main surface of said semiconductor substrate where said insulating film has been formed;

a step in which mirror surface treatment is performed on said polycrystalline silicon layer;

a step in which another semiconductor substrate, upon which an oxidation treatment has been performed, is pressed onto a surface upon which said mirror surface treatment has been performed; and a step in which said semiconductor substrate is polished from a main surface at an opposite side to expose said insulating film.

2. A method for manufacturing a dielectric isolation substrate according to claim 1, wherein:

said dummy grooves are formed in said peripheral area of said semiconductor element formation area which does not include a circumferential edge portion of said semiconductor substrate.

3. A method for manufacturing a dielectric isolation substrate according to claim 1, wherein:

density of said dummy grooves per unit area is larger than a density of said grooves formed in said semiconductor element formation area per unit area.

4. A method for manufacturing a dielectric isolation substrate according to claim 1, wherein:

said dummy grooves are formed to become gradually deeper toward outside of said semiconductor substrate.

5. A method for manufacturing a dielectric isolation substrate according to claim 1, wherein:

in a dummy groove formation area where said dummy grooves are formed, deeper dummy grooves are formed in the vicinity of a central area thereof.

6. A method for manufacturing a dielectric isolation substrate according to claim 1, wherein:

said dummy grooves are formed at a side opposite from a position at which said another semiconductor substrate is pasted up.

7. A method for manufacturing a dielectric isolation substrate according to claim 1, wherein:

said dummy grooves are formed at a side where said semiconductor substrate and said another semiconductor substrate are placed in close contact last.

8. A method for manufacturing a dielectric isolation substrate according to claim 1, wherein:

said dummy grooves are formed at a side opposite from an orientation flat.

9. A method for manufacturing a dielectric isolation substrate according to claim 1, wherein:

said dummy grooves are provided over an entire surface of said peripheral area of said semiconductor element formation area.

* * * * *